(12) United States Patent
Kloosterman et al.

(10) Patent No.: US 10,417,154 B2
(45) Date of Patent: Sep. 17, 2019

(54) UNIVERSAL CONVERSION SYSTEM AND A METHOD FOR IMPROVING THE MODE OF ACTION OF THE SAME

(71) Applicants: Karin Kloosterman, Newmarket (CA); Amichai Yifrach, Kdumim (IL); Nir Hertzman, Zichron Yakov (IL)

(72) Inventors: Karin Kloosterman, Newmarket (CA); Amichai Yifrach, Kdumim (IL); Nir Hertzman, Zichron Yakov (IL)

( * ) Notice: Subject to any disclaimer, the term of this patent is extended or adjusted under 35 U.S.C. 154(b) by 0 days.

(21) Appl. No.: 15/568,617

(22) PCT Filed: Apr. 27, 2016

(86) PCT No.: PCT/IL2016/050441
§ 371 (c)(1),
(2) Date: Oct. 23, 2017

(87) PCT Pub. No.: WO2016/174676
PCT Pub. Date: Nov. 3, 2016

(65) Prior Publication Data
US 2018/0143926 A1    May 24, 2018

Related U.S. Application Data

(60) Provisional application No. 62/153,077, filed on Apr. 27, 2015.

(51) Int. Cl.
*G06F 13/38* (2006.01)
*H03M 1/12* (2006.01)
*H04R 1/00* (2006.01)

(52) U.S. Cl.
CPC ............ *G06F 13/385* (2013.01); *H03M 1/12* (2013.01); *H04R 1/00* (2013.01); *G05B 2219/25098* (2013.01)

(58) Field of Classification Search
CPC .... G06F 13/385; G06F 13/4022; H03M 1/12; H04R 1/00; H04Q 3/0004; H04L 49/101; H04L 49/106; H04L 49/1576
(Continued)

(56) References Cited

U.S. PATENT DOCUMENTS 5,918,194 A    6/1999  Banaska et al.
6,115,654 A *  9/2000  Eid .......................... G01D 21/02
                                                               244/1 R
(Continued)

FOREIGN PATENT DOCUMENTS

WO    2014129966 A1    8/2014

*Primary Examiner* — Glenn A. Auve
(74) *Attorney, Agent, or Firm* — Avery N. Goldstein; Blue Filament Law PLLC

(57) ABSTRACT

The present invention provides universal conversion system, comprising: at least one universal port connected with a connector to a smart X-bar, and at least one type of sensing circuitry connected with a connector to the smart X-bar, wherein each universal port is configured to connect with a connector to a transducer, each type of sensing circuitry is configured to measure a different type of electrical information, and the smart X-bar is configured to connect each universal port with each type of sensing circuitry. The present invention further provides a method for utilizing information accumulated in a database of a network for improving the mode of action of a plurality of universal conversion systems connected to the network.

12 Claims, 1 Drawing Sheet

(58) Field of Classification Search
USPC .......................................................... 710/317
See application file for complete search history.

(56) References Cited

U.S. PATENT DOCUMENTS

| | | | | |
|---|---|---|---|---|
| 6,601,124 B1* | 7/2003 | Blair | ........................ | G06F 13/38 |
| | | | | 710/305 |
| 7,685,313 B1* | 3/2010 | Kanevsky | ............... | H04L 69/08 |
| | | | | 709/206 |
| 2003/0091062 A1* | 5/2003 | Lay | .................... | H04Q 11/0478 |
| | | | | 370/463 |
| 2003/0225818 A1* | 12/2003 | Nair | ........................ | H04L 69/16 |
| | | | | 709/200 |
| 2014/0281113 A1* | 9/2014 | Trethewey | .......... | G06F 13/4022 |
| | | | | 710/317 |
| 2016/0183836 A1* | 6/2016 | Muuranto | .......... | A61B 5/04288 |
| | | | | 600/301 |

* cited by examiner

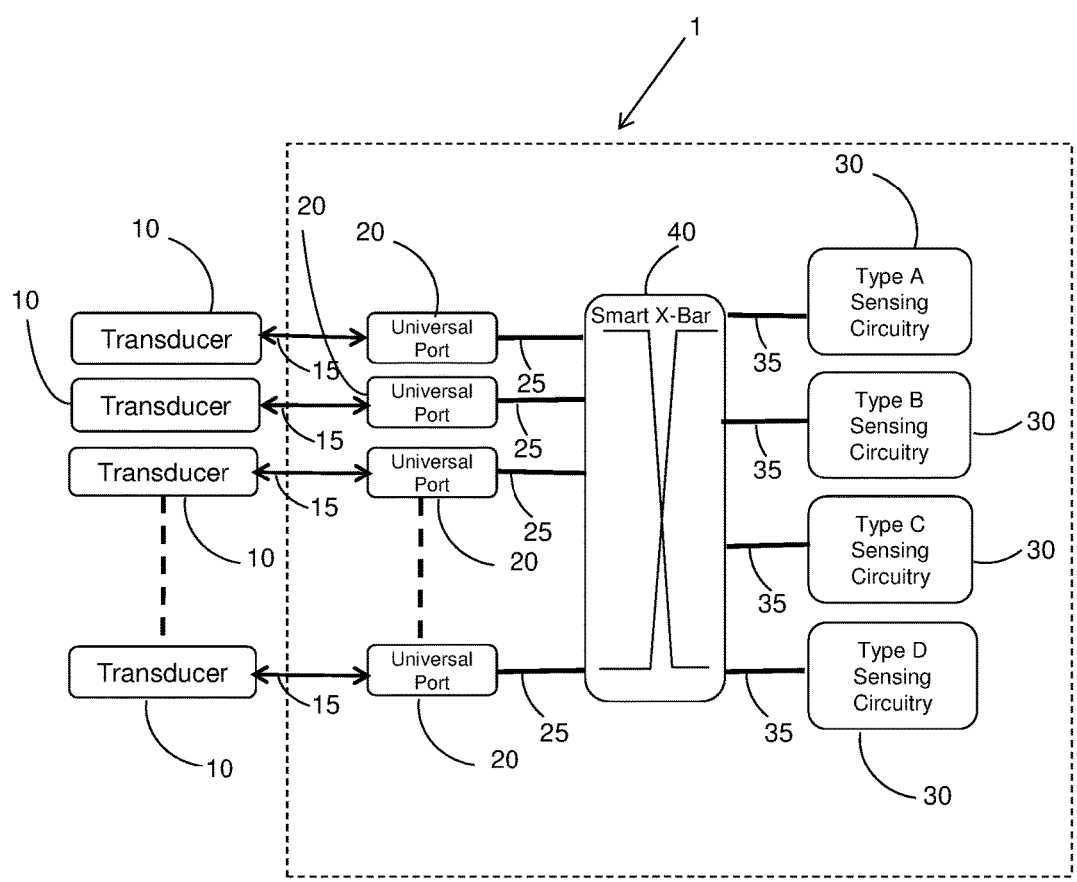

UNIVERSAL CONVERSION SYSTEM AND A METHOD FOR IMPROVING THE MODE OF ACTION OF THE SAME

CROSS-REFERENCE TO RELATED APPLICATIONS

This application claims priority to U.S. Provisional Patent Application No. 62/153,077, filed Apr. 27, 2015, the contents of which is incorporated herein by reference in its entirety.

FIELD OF THE INVENTION

The present invention relates to input/output ports. More particularly, the present invention relates to universal input/output ports.

BACKGROUND OF THE INVENTION

Internet of things is a network of physical objects—devices, vehicles, buildings, and other items—embedded with electronics, sensors, and network connectivity that enables these objects to collect and exchange data. The internet of things allows objects to be sensed and controlled remotely across existing network infrastructure, creating opportunities for more direct integration of the physical world into computer-based systems, and resulting in improved efficiency, accuracy and economic benefit. When the internet of things is augmented with sensors and actuators, it promotes technologies such as smart grids, smart homes, intelligent transportation, smart energy management and smart cities. Each thing in the internet of things is uniquely identifiable through its embedded computing system, but is able to interoperate within existing internet infrastructure. Furthermore, the internet of things has the ability to transfer data over a network without requiring human-to-human or human-to-computer interaction, as well as allowing unstructured machine-generated data to be analyzed for insights that will drive improvements.

Generally, an internet of things-based network comprises input sources and output targets. A sensor is an example of an input source. An input source gathers physical information, for example images, sounds, temperature, humidity, pH of liquids and the like. In order to transfer the physical information gathered by the input source to other components of the network, for example a computing device, the physical information is converted to electrical information which is transferable in the network. Similarly, electrical information transferred through the network to an output target, for example a device like a motor, a pump, a heater and the like, should be converted to a type of electrical information recognizable by the output target.

Various types of input sources convert physical information to different types of electrical information, for example voltage, current, resistance and the like. In other words, each type of input source converts a physical information to a certain type of electrical information. Similarly, output targets operate when electrical information of a certain type, for example voltage, current, resistance, and the like is received. Therefore, different types of input ports are used in order to receive information from different types of input sources, and different types of output ports are used in order to transmit information to different types of output targets. In small networks comprising a few input sources and output targets, the need to use a different input or output port for each input source or output target, may me tolerable. However, large networks, like networks involved for example in smart city management systems, may use a huge amount of input sources and output targets—thus demanding the use of a huge amount of different types of input ports and output ports. Furthermore, as a result of the nature of such huge systems, input sources and output targets may be changed for example as a result of change in needs, or development of advanced technologies. In this case, usage of a different type of input port for each input source and a different type of output port for each output target may be cumbersome and expensive. Furthermore, automation of such huge networks may be impaired due to the need to change input or output ports any time an input source or output target is changed.

In addition, during the operation of a network based on the model of internet of things—a massive amount of information may be accumulated. This massive information has a potential to be exploited for improving the operation of the network.

A solution that will negate the need for a different type of port for each type of input source or output target which is connected to a network, and facilitate the exploitation of accumulated information for improving the operation of the network is advantageous—especially in the context of networks based on the model of internet of things.

SUMMARY OF THE INVENTION

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

According to one aspect of the present invention, there is provided a universal conversion system, comprising: at least one universal port connected with a connector to a smart X-bar, and at least one type of sensing circuitry connected with a connector to the smart X-bar, wherein each universal port is configured to connect with a connector to a transducer, each type of sensing circuitry is configured to measure a different type of electrical information, and the smart X-bar is configured to connect each universal port with each type of sensing circuitry.

According to one embodiment, the transducer is an information source.

According to another embodiment, the transducer is an output target.

According to yet another embodiment, the sensing circuitries are configured to operate in a combination that forms a certain type of dedicated electrical information measurement unit.

According to still another embodiment, the dedicated electrical information measurement unit is dynamic.

According to a further embodiment, the connectors are configured to transmit electrical information in any direction.

According to yet a further embodiment, the universal conversion system is connected to a network through an analog-digital converter.

According to still a further embodiment, the analog-digital converter is configured to convert an electrical output of the universal conversion system to digital binary information recognizable by the network.

According to an additional embodiment, the analog-digital converter is configured to convert digital binary information from the network to electrical information recognizable by the universal conversion system.

According to another aspect of the present invention, there is provided a method for utilizing information accumulated in a database of a network for improving the mode of action of a plurality of universal conversion systems connected to the network, the method comprising: acquiring information about an improved mode of action of a universal conversion system; storing the information in a database; assigning to the information an end-user need; updating all the universal conversion systems connected to the network, and having the assigned end-user need, with the information about the improved mode of action, and changing the mode of action of the updated universal conversion systems according to the information.

According to one embodiment, the information about the improved mode of action of the universal conversion system is acquired by a universal conversion system connected to the network.

According to another embodiment, the information about the improved mode of action of the universal conversion system is acquired by a user of the network.

BRIEF DESCRIPTION OF THE DRAWINGS

Embodiments are herein described, by way of example only, with reference to the accompanying drawings. With specific reference now to the drawings in detail, it is stressed that the particulars shown are by way of example and for purposes of illustrative discussion of the preferred embodiments, and are presented in the cause of providing what is believed to be the most useful and readily understood description of the principles and conceptual aspects of the embodiments. In this regard, no attempt is made to show structural details in more detail than is necessary for a fundamental understanding, the description taken with the drawings making apparent to those skilled in the art how several forms may be embodied in practice.

In the drawings:

FIG. 1 schematically illustrates, according to an exemplary embodiment, a block diagram of a universal conversion system.

DESCRIPTION OF THE PREFERRED EMBODIMENTS

Before explaining at least one embodiment in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting. In discussion of the various figures described herein below, like numbers refer to like parts. The drawings are generally not to scale.

For clarity, non-essential elements were omitted from some of the drawings.

One aim of the present invention is to provide a system that will negate the need for a different type of port for each type of input source or output target which is connected to a network.

Another aim of the present invention is to provide a method for facilitating the exploitation of accumulated information for improving specifically the operation of input sources or output targets, and generally the operation of a network.

FIG. 1 schematically illustrates, according to an exemplary embodiment, a block diagram of a universal conversion system 1. According to one embodiment, the universal conversion system 1 is configured to convert any type of physical information to any kind of electrical information. According to another embodiment, the universal conversion system 1 is configured to convert any type of electrical information to any type of physical information.

The universal conversion system 1 comprises at least one universal input/output port 20—designated hereinafter as universal port 20, a smart cross bar 40, also designated smart X-bar 40, and at least one type of sensing circuitry 30. Each universal port 20 is configured to be connected to a transducer 10, using a connector 15. Each universal port is connected with a connector 25 to the smart X-bar 40, and each sensing circuitry 30 is also connected to the smart X-bar 40 with a connector 35.

According to one embodiment, a transducer 10 is an information source, configured to convert a certain physical phenomenon to a certain electrical information. Any type of information source is under the scope of the present invention, for example but not limited to, a temperature sensor, a pH sensor, a light intensity sensor and the like. Thus, any type of physical information known in the art which is convertible by an information source is under the scope of the present invention, for example but not limited to, temperature, pH, light intensity and the like. In addition, any type of electrical information known in the art which is generated by an information source is under the scope of the present invention, for example but not limited to, electrical current, electrical potential—also known as voltage, electrical resistance/conductivity, electrical capacity and the like.

According to another embodiment, a transducer 10 is an output target, configured to convert a certain electrical information to a certain physical information. Any type of output target known in the art is under the scope of the present invention, for example but not limited to, any type of device such as a motor, a pump, a heater, a light source and the like. Thus, any type of electrical information known in the art which is converted by an output target is under the scope of the present invention, for example but not limited to, electrical current, electrical potential—also known as voltage, electrical resistance/conductivity, electrical capacity and the like. In addition, any type of physical information known in the art which is generated by an output source is under the scope of the present invention, for example but not limited to, kinetic force, heat, light and the like.

According to one embodiment, the universal conversion system 1 is configured to connect to at least one information source as a transducer 10. According to another embodiment, the universal conversion system 1 is configured to connect to a least one output target as a transducer 10. According to a further embodiment, the universal conversion system 1 is configured to connect to a combination of at least one information source and at least one output target as transducers 10.

Each type of sensing circuitry 30 is configured to measure a different type of electrical information. Any type of sensing circuitry 30 known in the art is under the scope of the present invention, including voltage meter, current meter, resistance\conductivity meter, frequency meter, amplification stage, buffering stage, filtering stage, pulse counter, phase meter, binary gate and the like. According to one embodiment, the sensing circuitries 30 are configured to operate individually. According to another embodiment, the sensing circuits 30 are configured to operate in any combination thereof. This is achieved by a series of a plurality of electrical switches (not shown) configured to interconnect the sensing circuitries 30. The operation of the sensing circuits 30 individually, or in combination thereof, forms a certain type of dedicated electrical information measurement unit. The combination of sensing circuitries 30 of the dedicated electrical information measurement unit is dynamic, namely it is changed according to the type of electrical information received by the dedicated electrical information measurement unit, or by the type of electrical information needed to be transmitted by the dedicated electrical information measurement unit.

Each transducer 10 is connected with a connector 15 to a universal port 20, and with a connector 25 to the smart X-bar 40, and each sensing circuitry 30 is connected with a connector 35 to the smart X-bar. The connector 15, connector 25 and connector 35 are configured to transmit electrical information in any direction. Therefore, when according to one embodiment the transducer 10 is an information source, connector 15 is configured to transmit electrical information from an input source to a universal port 20, connector 25 is configured to transmit electrical information from a universal port 20 to the Smart X-bar 40, and connector 35 is configured to transmit electrical information from the smart X-bar to a sensing circuitry 30. On the other hand, when according to another embodiment the transducer 10 is an output target, connector 35 is configured to transmit electrical information from a sensing circuitry 30 to the smart X-bar 40, connector 25 is configured to transmit electrical information from the Smart X-bar 40 to a universal port 20, and connector 15 is configured to transmit electrical information from a universal port 20 to an output target.

The smart X-bar 40 comprises a matrix of a plurality of electrical switches (not shown), configured to connect each universal port 20 with each type of sensing circuitry 30, via connectors 25 and connectors 35, respectively. Therefore, the smart X-bar 40 is configured to mediate between a universal port 20 and a dedicated electrical information measurement unit formed by a certain combination of sensing circuitries 30.

As a result, when according to one embodiment the universal conversion system 1 is connected to a transducer 10 in the form of an information source, the information source transmits a certain type of electrical information to a universal port 20, and the electrical information is transmitted to the smart X-bar 40 which further transmits the electrical information to a dedicated electrical information measurement unit formed by a certain combination of sensing circuitries 30. Then, the dedicated electrical information measurement unit measures the electrical information and produces an electrical output. Therefore, there is no need for a dedicated port for each type of information source connected to the universal conversion system 1, because the universal conversion system 1 measures the electrical information formed by the information source by transmitting the electrical information through the smart X-bar 40 to the dedicated electrical information measurement unit formed by a certain combination of sensing circuitries 30.

Similarly, when according to another embodiment, the universal conversion system 1 is connected to a transducer 10 in the form of an output target, a dedicated electrical information measurement unit formed by a certain combination of sensing circuitries 30 receives an electrical input and as a result produces a certain type of electrical information which is suitable for the output target connected to the universal conversion system 1. The certain type of electrical information is transmitted from the sensing circuits 30 to the smart X-bar 40, which in turn transmits the electrical information to the universal port 20 to which the output target is connected. Therefore, there is no need for a dedicated port for each type of output target connected to the universal conversion system 1, because the universal conversion system 1 produces the desired type of electrical information for the connected output source, by using the dedicated electrical information measurement unit formed by a certain combination of sensing circuitries 30.

According to some embodiments, the universal conversion system 1 is connected to a computerized network, designated hereinafter as "network". Therefore there is a need to convert the electrical output of the dedicated electrical information measurement unit formed by a certain combination of sensing circuitries 30 to digital binary information. This is achieved by using an analog-digital converter (not shown) which is connected to the at least one sensing circuitries 30. The analog-digital converter is configured to convert an electrical output to digital binary information which is recognizable by the network. Similarly, when a network transmits digital binary information to the universal conversion system 1, the analog-digital converter converts the digital binary information to electrical information which is recognizable by the universal conversion system 1.

During its operation, the universal conversion system 1 acquires information through transducers 10 connected to its universal ports 20—for example, information acquired by an information source sensing a certain physical phenomenon. In addition, information about the mode of operation of the universal conversion system 1 is also available. This information, when stored in a database, or any other element known in the art which is configured to store information, may be utilized to improve the mode of action of the universal conversion system 1, in a process known as "learning".

However, according to some embodiments, a plurality of universal conversion systems are connected to a network comprising a database, or any other element known in the art which is configured to store information. Therefore, information acquired by the plurality of universal conversion systems is stored in the database of the network. Furthermore, users connected to the network may upload to the database of the network information which is relevant to the mode of action of the plurality of universal conversion systems. As a result, a great amount of information relevant to the mode of action of the plurality of universal conversion systems is accumulated in the database of the network.

The present invention provides a method for utilizing information accumulated in a database of a network for improving the mode of action of a plurality of universal conversion systems connected to the network, the method comprises:

acquiring information about an improved mode of action of
   a universal conversion system;
storing the information in a database;
assigning to the information an end-user need;
updating all the universal conversion systems connected to
   the network, and having the assigned end-user need, with
   the information about the improved mode of action,
and changing the mode of action of the updated universal
   conversion systems according to the information.

According to one embodiment, the information about the improved mode of action of the universal conversion system is acquired by a universal conversion system connected to the network.

According to another embodiment, the information about the improved mode of action of the universal conversion system is acquired by a user of the network.

According to some embodiments, this method is operated automatically, without a need to change any hardware or software in the network specifically, and more particularly in the universal conversion system.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. A universal conversion system, comprising:
   at least one universal port connected with a connector to a matrix of a plurality of electrical switches, and
   at least one type of sensing circuitry connected with a connector to the matrix of a plurality of electrical switches, wherein each universal port is configured to connect with a connector to a transducer of a series of transducers, each type of sensing circuitry is configured to measure a different type of electrical information, and the matrix of a plurality of electrical switches is configured to connect each universal port with each type of sensing circuitry.

2. The universal conversion system of claim 1, wherein each of the transducers of the series of transducers is an information source.

3. The universal conversion system of claim 1, wherein each of the transducers of the series of transducers is an output target.

4. The universal conversion system of claim 1, wherein the at least one type of sensing circuitry is configured to operate in a combination that forms a certain type of dedicated electrical information, the electrical information provided in measurement units of at least one of voltage, current, resistance, conductivity, amplitude, frequency, or phase.

5. The universal conversion system of claim 4, wherein the type of dedicated electrical information measurement unit is dynamic.

6. The universal conversion system of claim 1, wherein the connectors are configured to transmit electrical information in any direction.

7. The universal conversion system of claim 1, wherein the universal conversion system is connected to a network through an analog-digital converter.

8. The universal conversion system of claim 7, wherein the analog-digital converter is configured to convert an electrical output of the universal conversion system to digital binary information recognizable by the network.

9. The universal conversion system of claim 7, wherein the analog-digital converter is configured to convert digital binary information from the network to electrical information recognizable by the universal conversion system.

10. A method for utilizing information accumulated in a database of a network for updating an operating mode of a plurality of universal conversion systems connected to the network, the method comprising:
    acquiring information about the updated operating mode of the universal conversion systems;
    storing the information in a database;
    assigning to the information an end-user need;
    updating all the universal conversion systems connected to the network with the information about the updated operating mode, the universal conversion systems having the end-user need assigned to the information, and changing the operating mode of the updated universal conversion systems according to the information.

11. The method of claim 10, wherein the information about the updated operating mode of the universal conversion system is acquired by a universal conversion system connected to the network.

12. The method of claim 10, wherein the information about the updated operating mode of the universal conversion system is acquired by a user of the network.

* * * * *